United States Patent [19]

Fukahori et al.

[11] 4,374,335
[45] Feb. 15, 1983

[54] TUNEABLE I.C. ACTIVE INTEGRATOR

[75] Inventors: Kiyoshi Fukahori; Yukio Nishikawa, both of San Jose, Calif.

[73] Assignee: Precision Monolithics, Inc., Santa Clara, Calif.

[21] Appl. No.: 151,419

[22] Filed: May 19, 1980

[51] Int. Cl.³ .................. H03H 11/12; H03L 7/08
[52] U.S. Cl. ............................ 307/521; 328/127; 328/167; 328/172; 331/25; 331/108 B; 331/135
[58] Field of Search .............. 307/493, 494, 520, 521, 307/490; 328/167, 127, 172; 333/214, 167, 168, 172; 331/17, 18, 25, 8

[56] References Cited

U.S. PATENT DOCUMENTS

| | | | |
|---|---|---|---|
| 3,444,362 | 5/1969 | Pearlman | 307/492 |
| 3,696,252 | 10/1972 | Chapman | 307/520 |
| 3,805,091 | 4/1974 | Colin | 328/167 X |
| 3,911,776 | 10/1975 | Beigel | 307/521 X |
| 3,978,416 | 8/1976 | Sutphin, Jr. | 328/167 |

OTHER PUBLICATIONS

Tan et al., "Fully Integrated Analog Filters Using Bipolar-JFET Technology", IEEE Journal of Solid State Circuits, vol. SC-13, Dec. 1978, pp. 814–821.
Khen-Sang Tan and Paul R. Gray, "High Order Monolithic Analog Filters Using Bipolar JFET Technology," Digest of Technical Papers, 1978 IEEE International Solid-State Circuits Conference, pp. 80–81, Feb., 1978.
B. Gilbert, "A precise 4-Quadrant Multiplier with Sub-Nanosecond Response," IEEE Solid-State Circuits, vol. Sc-3, No. 4, pp. 365–373, Dec., 1968.

*Primary Examiner*—Siegfried H. Grimm
*Attorney, Agent, or Firm*—Richard S. Koppel

[57] ABSTRACT

An I.C. integrator circuit is provided with an active tuneable element by which a precise integrator time constant can be established, despite variations in the values of individual circuit components. A plurality of integrator circuits are connected in an overall frequency responsive circuit, each integrator circuit having a input transconductance stage, an output integrating stage, and an adjustable intermediate conditioning stage, the latter stage preferably comprising a Gilbert multiplier circuit. The time constant of each integrator circuit is controlled by the conditioning stage, which in turn is under the control of a bias circuit common to all of the integrator circuits. A desired net frequency response characteristic can be achieved by simple adjustments to the common bias circuit, despite normal tolerances and variations among individual integrator circuits.

The circuit is completely integrated, is capable of operating at audio as well as at higher frequency ranges, has a greater tuneable range than prior art devices, and is highly linear.

5 Claims, 4 Drawing Figures

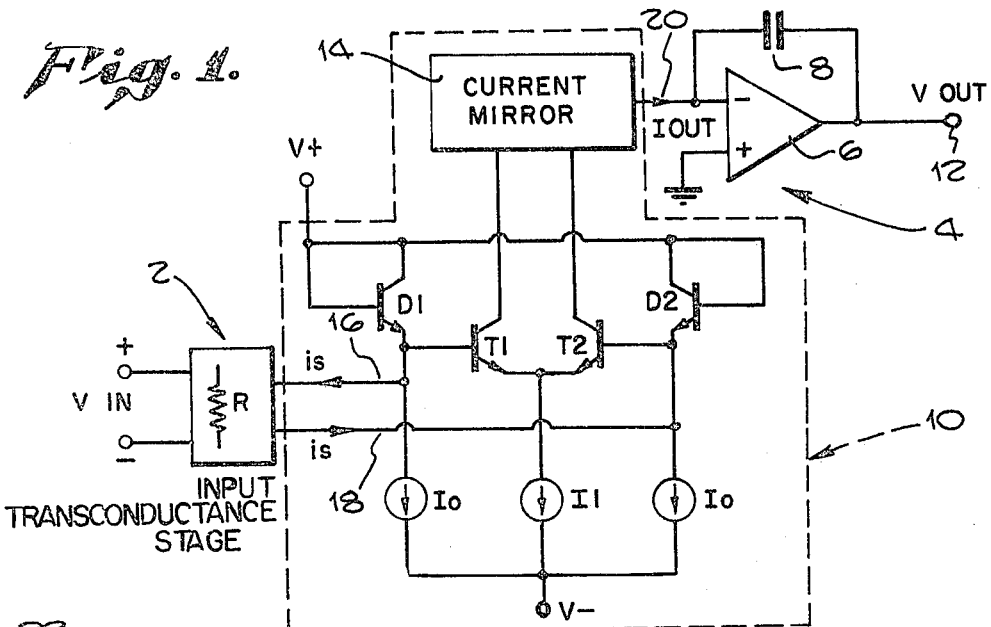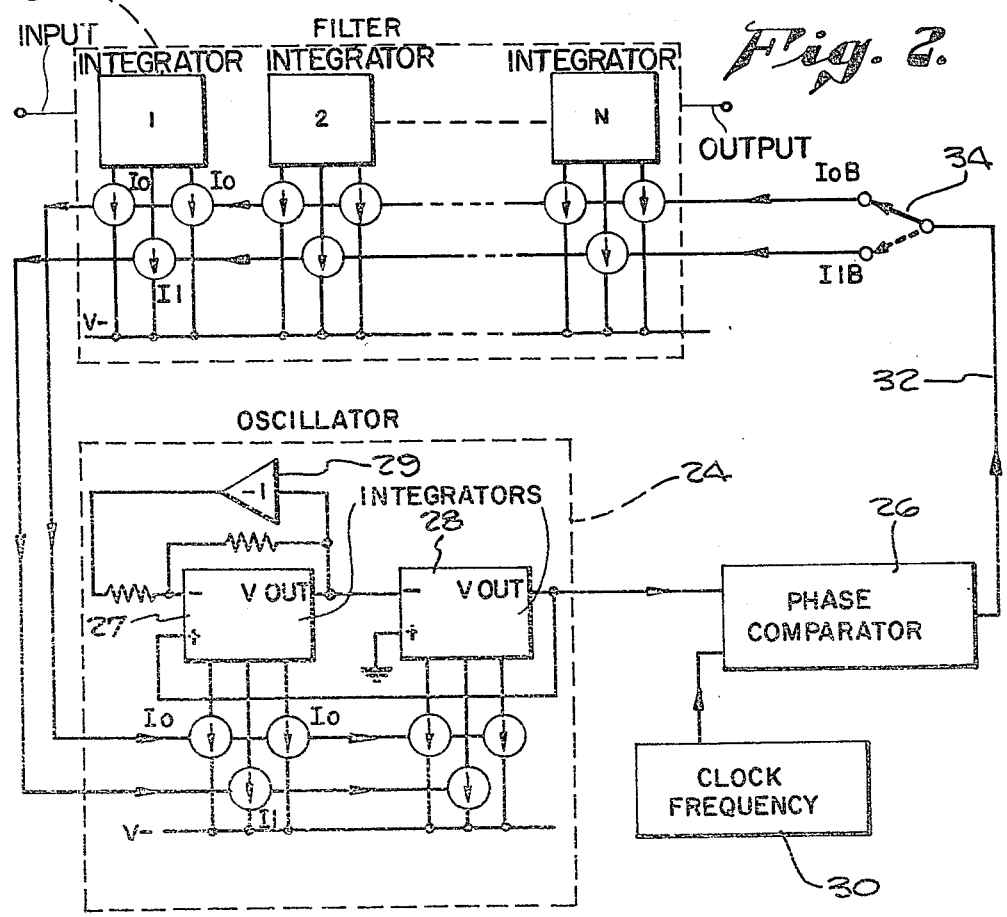

TUNEABLE I.C. ACTIVE INTEGRATOR

BACKGROUND OF THE INVENTION

A. Field of the Invention

This invention relates to integrated circuits, and more particularly to integrated circuit (I.C.) integrators employing active elements which can be tuned to achieve a desired frequency response.

B. Description of the Prior Art

Historically, filtering has been accomplished by using inductors and capacitors to form passive LC circuits. Such circuits utilize the energy storage capabilities of both the inductors and capacitors, and have been extensively used.

More recently, integrated circuits and resistor-capacitor (RC) active filters have emerged, both having distinct advantages over the older discrete element filters. Whereas LC filters employ large and bulky inductors and attenuated input signals, RC active filters do not need the large inductor elements, and can provide gain to prevent a loss in signal amplitude.

The advent of active RC filters has also been accompanied by some practical problems. For example, both passive LC and active RC filters depend upon the absolute values of their respective components to achieve accurate filtering. In both cases, in order to obtain the desired frequency selective characteristics, either expensive high-precision components have to be selected, or the components have to be trimmed, a slow and expensive manufacturing operation. Furthermore, while capacitors are susceptible to integrated circuit techniques whereas inductors are not, the tolerances inherent in the manufacturing processes for integrated circuits are such that it is difficult to form either resistors or capacitors with sufficient accuracy of absolute values to satisfy the requirements of active RC circuits.

The surface area occupied by I.C. capacitors imposes an additional limitation on their use in active filter circuits. The manufacturing yield of an I.C. circuit decreases as the area occupied by the circuit increases, as a result of which I.C. design is oriented toward minimizing area. For high frequency filtering, the time constants of the required integrators are small enough that they can be made in I.C. form with acceptable yields. However, at low frequencies in the audio range, the time constants are so large that external capacitors have been used instead of I.C. capacitors. I.C. capacitors have generally been restricted to values below a few thousand picofarads because of the large area occupied by larger capacitors.

There thus exists a need for an approach that can achieve the benefits of I.C. technology for an integrating function in the low frequency range, but which avoids the uneconomical loss in yield accompanying the use of large capacitors. One such technique is described in a paper by Khen-Sang Tan and Paul R. Gray, "High-Order Monolithic Analog Filters Using Bipolar JFET Technology", Digest of Technical Papers, 1978 IEEE International Solid-State Circuits Conference, pages 80–81, 268. This paper describes filters with a plurality of similary constructed I.C. integrator circuits. Each integrator circuit has an input stage with a transconductance defined by a network of high pinch-off junction field effect transistors (JFETS), and an output gain stage with a feedback capacitor. Multiplying the input stage resistance by the value of the feedback capacitor gives an equivalent time constant for each integrator. By varying the biasing current for the JFET input stage, the transconductance of that stage, and hence the gain constant of the entire integrator, can be varied. Biasing current sources for the various integrators are matched, and their respective capacitors are ratioed. By connecting the integrator circuits in a phase-lock-loop system with a voltage-controlled-oscillator (VCO) using integrators whose characteristics were precisely matched with the filter integrators, and having an oscillation frequency directly related to the desired filter frequency response, the cutoff frequency of the resulting filter was reported to track the external frequency, independent of process and temperature variations affecting the absolute magnitudes of the individual integrator gain constants.

The above circuit represents a significant improvement, in that it avoids the use of a single large capacitor by employing a plurality of integrators having low transconductance input stages, to achieve a large time constant. This technique is better suited for I.C. fabrication than is the former practice. However, it has been found to have certain deficiencies. Because it employs ion-implanted JFETs which exhibit large processing variations, there is a large variation in the absolute values of the integration constants for the various integrator circuits. Furthermore, since it utilizes the weak transconductance dependence of JFETs on drain current in their linear (non-saturated) range of operation to vary the value of integration constants, the tunable range of the resulting filter is quite small. Even large changes in drain current will not change the transconductance very much. Also, since JFETs are basically non-linear devices, the output current of the input transconductance stage is not linear with respect to the input voltage.

There is thus still a need for an economical I.C. integrator which can operate at low frequencies, and has a predictable and controllable frequency response despite considerable processing and temperature variations.

SUMMARY OF THE INVENTION

In view of the above problems associated with the prior art, it is an object of this invention to provide I.C. integrators whose integration time constants can be matched with each other, which are highly accurate and use inexpensive components, yet do not require trimming.

Another object is the provision of I.C. integrators which are capable of low frequency operation without the use of external capacitors.

A further object is the provision of I.C. integrators which avoid the problems associated with the process varation extremes encountered with the Tan-Gray approach, achieve a greater frequency range, and exhibit higher linearity.

These and other objects of the invention are achieved by the provision of an integrator circuit comprising an input transconductance stage, an output integrating stage, and an intermediate conditioning stage, in which the conditioning stage can be adjusted to obtain a desired integration constant. A plurality of similar integrator circuits are connected in an overall frequency responsive circuit, with a common bias circuit controlling the adjustment for the conditioning stage of each integrator. The common bias circuit has a single adjustment mechanism, by which the individual time constants of all the integrators can be readily controlled. Corresponding components in the various integrators are matched with each other for precise matching of time constants; this matching is maintained during bias adjustments.

In the preferred embodiment, the transconductance of the input stage is established by a passive resistance element, the output stage includes an integrating capacitance means, and the intermediate stage comprises a Gilbert multiplier circuit. The resistive elements and integrating capacitors of each integrator are matched with those of the other integrators. Common bias means provide a common control for at least one of the $I_o$ and $I_1$ current sources in each Gilbert multiplier. The common bias means are adjustable so that, with a single adjustment, the operation of each conditioning stage can be controlled to achieve a desired overall frequency response.

DESCRIPTION OF THE DRAWINGS

Further advantages and features of the invention will be apparent to those skilled in the art from the following detailed description thereof, taken together with the accompanying drawings, in which:

FIG. 1 is a circuit diagram illustrating the principal elements of an integrator circuit utilizing the present invention;

FIG. 2 is a block diagram showing one application of the invention—a phase locked filter employing a plurality of integrators of the type illustrated in FIG. 1, with a common bias circuit controlling the filter output;

DETAILED DESCRIPTION OF A PREFERRED EMBODIMENT

Figure 3:
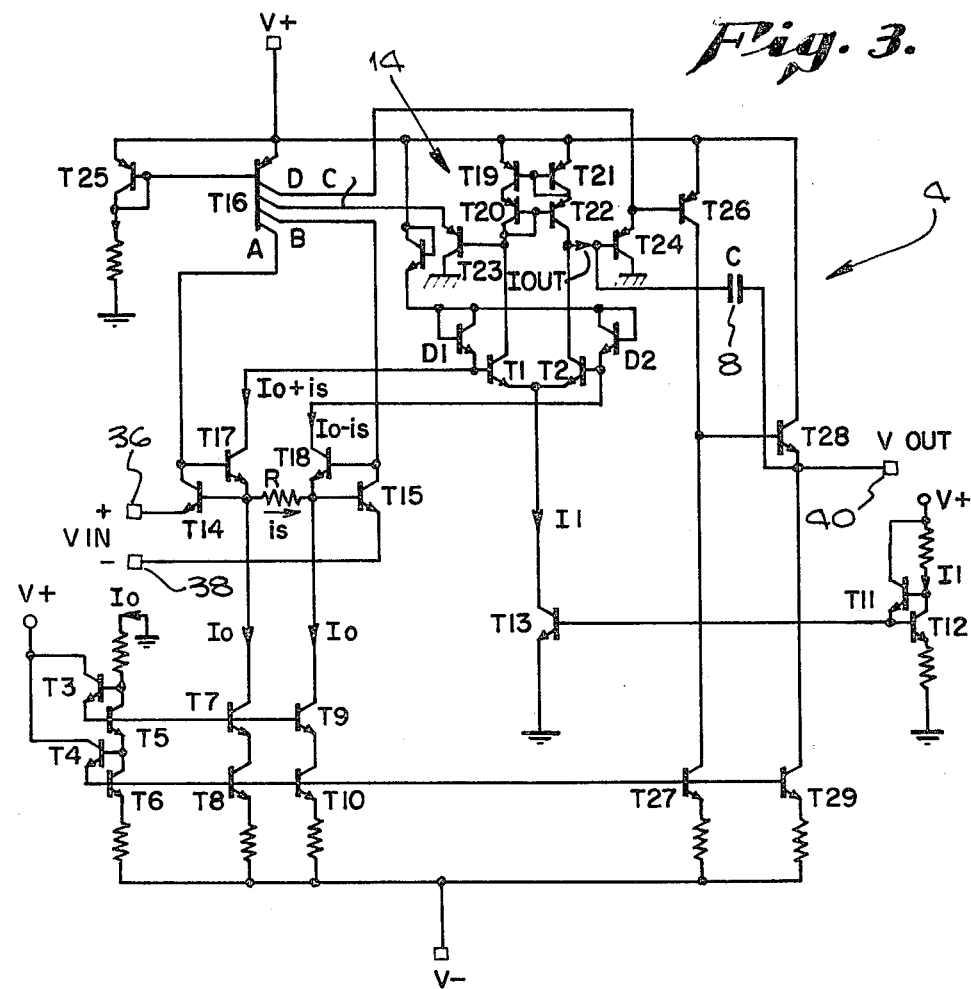
FIG. 3 is a detailed schematic diagram of the integrator circuit illustrated in FIG. 1.

FIG. 1 shows the basic components of an integrator circuit which is utilized in the present invention as a building block for constructing an overall frequency responsive circuit. The principal elements of the integrator are an input transconductance stage 2 which receives an input voltage signal $V_{in}$ and converts it to a differential current output $i_s$, an output stage 4 comprising a high gain amplifier 6 with an integrating capacitor 8 connected in parallel with the amplifier, and an intermediate conditioning stage 10 outlined in dashed lines. Conditioning stage 10 receives the $i_s$ current signal from input stage 2 and conditions it so that, when applied to output stage 4, the resulting signal at output terminal 12 may be processed with the output signals of other integrators to produce a desired aggregate frequency response characteristic. For simplicity, bias and other detailed circuitry is not shown in FIG. 1.

Conditioning circuit 10 includes a Gilbert multiplier circuit, and a current mirror 14 interfacing with the output integrating stage 4. A detailed description of the design and functioning of a Gilbert multiplier circuit may be found in an article by G. Gilbert, "A Precise 4-Quadrant Multiplier With Sub-Nanosecond Response", (IEEE) Solid State Circuits, Volume SC-3, No. 4, pages 365-373, December, 1968. The Gilbert multiplier circuit in FIG. 1 is of conventional design, including a pair of identical current sources $I_o$ and another current source $I_1$, each driving current toward a negative voltage bus $V^-$. Preconditioning diode-connected transistors $D_1$ and $D_2$ are connected to conduct current from a positive voltage bus $V+$ to each of the $I_o$ current sources, respectively. A pair of transistors $T_1$ and $T_2$ provide a circuit connection between current mirror 14 and current source $I_1$. The bases of $T_1$ and $T_2$ are respectively connected to the emitter outputs of $D_1$ and $D_2$ leading to the $I_o$ current sources, such that the biasing on $T_1$ and $T_2$ is determined by the current flow through $D_1$ and $D_2$. The effect of conditioning stage 10 is to change the effective input stage transconductance presented to output stage 4 by a factor of $I_1/I_o$.

The input transconductance stage 2 has a pair of output leads 16 and 18, the first of which is connected to the junction between the emitter of $D_1$, the base of $T_1$ and the first $I_o$ current source, and the second of which is connected to the junction of the emitter of $D_2$, the base of $T_2$ and the second $I_o$ current source. Input voltage Vin establishes a differential signal current $i_s$ through the transconductance stage 2. This current flows into the emitter of $D_2$, and out of the transconductance stage over line 18. It also flows into the transconductance stage over line 16, and out of the emitter of $D_1$. The differential current $i_s$, which varies in proportion to Vin, thereby establishes a voltage differential between the bases of $T_1$ and $T_2$.

An output current Iout from conditioning stage 10, the magnitude of which is determined by the relative current flows through $T_1$ and $T_2$, is supplied over output line 20 to the junction of amplifier 6 and integrating capacitor 8. In accordance with the known Gilbert multiplier equation, the value of Iout over line 20 is:

$$\text{Iout} = V_{in} I_1 / I_o / R, \qquad (1)$$

where R is the resistance of input stage 2. The accuracy of this expression can be maintained over several decades of current variations in $I_o$ and $I_1$ provided that $T_1$, $T_2$, $D_1$ and $D_2$ are matched well. The resulting integration constant is given by the expression:

$$RC\, I_o / I_1, \qquad (2)$$

where C is the capacitance of integrating capacitor 8.

By employing common bias lines to establish $I_o$ and $I_1$, and by matching their input stage transconductances and their integrating capacitors, the integration constants of a plurality of integrators such as those shown in FIG. 1 can be well defined and matched with each other to produce a desired frequency response. Preferably, thin film resistors are employed in the input transconductance stage to enhance matching.

Referring now to FIG. 2, a generalized frequency responsive or filter circuit is shown. The overall circuit is formed as a composite of a plurality of individual integrators 1, 2,...N of the type shown in FIG. 1. The result is an Nth order filter circuit 22. To obtain the desired frequency response accuracy, filter 22 is connected in a phase lock loop with an oscillator 24 and a phase comparator 26. A common bias line $I_oB$ is provided for each $I_o$ source in the filter, and another common bias line $I_1B$ for each $I_1$ current source. The DC output from phase comparator 26 is used to control either the $I_oB$ or the $I_1B$ bias line, the bias for the other bias line being set up independently.

Oscillator 24 is formed from two integrators 27 and 28, with an inverter 29 connected between the band pass output and signal input for integrator 27. Integrators 27 and 28 are also controlled by $I_o$ and $I_1$ current sources in an identical manner as for the filter integrators. These current sources are connected in common with the common $I_oB$ and $I_1B$ bias lines, respectively, for the filter circuit. An external clock 30 is provided with an output frequency which is equal to the oscillation frequency to which VCO 24 is designed. Comparator 26 compares the actual frequency of the oscillator output with the precisely known frequency provided by clock 30, and produces a DC error signal over line 32 which is proportional to the phase difference between the compared signals. This DC error signal is fed back to control the common DC bias line for the filter and VCO integrators, as determined by switch 34. The DC error signal forces the integration time constants of VCO integrators 27 and 28 to assume their designed values corresponding to a VCO frequency equal to that of clock 30. Since the time constants of VCO integrators 27 and 28 are precisely matched with the time constants of the filter integrators 1, 2...N, the time constants of the filter integrators, and thus the filter frequency response, are held to their design values, despite variations in the absolute values of individual components. Adjustments applied by the phase comparator 26 to the selected $I_oB$ or $I_1B$ bias line automatically adjust the integration time constants of all the integrators used in the system. The overall filter response is thus kept accurate, without resorting to any physical trimming of components.

In the above implementation, although their absolute values may permissibly differ somewhat from nominal, the values of $I_o$, $I_1$, R, and C are accurately matched in desired proportions among the various integrators. For example, $I_o$, $I_1$ and R could be scaled in multiples of two, while the output capacitors of the different integrators could be scaled to the accuracy of photolithographic pattern definition.

Referring now to FIG. 3, a detailed circuit implementation of the integrator circuit of FIG. 1 is shown. An $I_o$ reference current is established by a circuit consisting of transistors $T_3$, $T_4$, $T_5$ and $T_6$. The collectors of $T_3$ and $T_4$ are connected to a positive voltage bus, while their emitters are connected to the bases of $T_5$ and $T_6$, respectively. The collector-emitter circuits of $T_5$ and $T_6$ are connected in a series circuit between ground and the negative voltage bus $V-$, with the bases of $T_3$ and $T_4$ connected to the collectors of $T_5$ and $T_6$, respectively.

A current value of $I_o$ is established through $T_5$ and $T_6$, and mirrored by a first pair of series connected transistors $T_7$ and $T_8$, and a second pair of series connected transistors $T_9$ and $T_{10}$. $I_1$ is established in a similar manner by a circuit consisting of transistors $T_{11}$ and $T_{12}$ connected between $V+$ and ground. The current value of $I_1$ set up through $T_{12}$ is mirrored by transistor $T_{13}$, which is connected to the emitters of $T_1$ and $T_2$ to function as the $I_1$ current source in the Gilbert multiplier circuit. $T_3$–$T_6$, $T_{11}$ and $T_{12}$ can be used to establish $I_o$ and $I_1$ for all of the integrators in a particular system.

Input signals are received at terminals 36 and 38 for an input transconductance amplifier which includes a resistance element R with an equivalent transconductance equal to 1/R. The amplifier also includes transistors $T_{14}$ and $T_{15}$, which have their bases connected to the opposite ends of R, their emitters connected to input terminals 36 and 38, respectively, and their collectors connected respectively to collectors A and B of a multi-collector transistor $T_{16}$. The said A and B collectors serve to keep the base-emitter voltages of $T_{14}$ and $T_{15}$ constant, independent of the input voltage applied across the emitters $T_{14}$ and $T_{15}$. The opposite ends of resistor R are connected respectively through the collector-emitter circuits of transistors $T_{17}$ and $T_{18}$ to the bases of $T_1$ and $T_2$ in the Gilbert multiplier circuit.

Current mirror 14 comprises transistors $T_{19}$ and $T_{20}$ connected in series between the positive voltage bus and the collector of $T_1$, and transistors $T_{21}$ and $T_{22}$ connected to series between the positive voltage bus and the collector of $T_2$. The C and D collectors of multi-collector transistor 16 are connected to the emitters of grounded-collector transistor $T_{23}$ and $T_{24}$, respectively. The bases of $T_{23}$ and $T_{24}$ are respectively connected to the collectors of $T_1$ and $T_2$ in the Gilbert multiplier circuit for balance. Biasing for multi-collector transistor $T_{16}$ is provided from the base of a diode-connected transistor $T_{25}$, which is connected from $V+$, through a resistor, to ground.

Integrating capacitor 8 receives the output of the Gilbert multiplier circuit from the collector of $T_2$. Connected in parallel with capacitor 8 is the output gain stage, comprising $T_{24}$, transistors $T_{26}$ and $T_{27}$ connected in a first series circuit between the positive and negative voltage buses, and transistor $T_{28}$ and $T_{29}$ connected in a separate series circuit between the two buses. $T_{27}$ and $T_{29}$ are connected in a common base configuration with $T_6$, $T_8$ and $T_{10}$, while the base of $T_{28}$ is connected between the collectors of $T_{26}$ and $T_{27}$, and the base of $T_{26}$ goes to the common connection between the emitter of $T_{24}$ and the D collector of $T_{16}$. The module output terminal 40 is connected to a common node between $T_{28}$ and $T_{29}$, at the opposite side of capacitor 8 from the Gilbert multiplier circuit.

When an input signal is applied to input terminals 36 and 38, a differential voltage Vin is developed across transconductance resistor R. This produces a differential current $i_s$ through resistor R. Since the current through transistors $T_7$–$T_{10}$ are fixed at $I_o$, $i_s$ is added to $I_o$ and delivered to the base of $T_1$ through $T_{17}$, subtracted from $I_o$ through $T_{18}$, and delivered to the base of $T_2$. Thus, the output current delivered from the Gilbert multiplier to charge up integrating capacitor 8 is given by $$Iout = VinI_1/I_o/R \qquad (3)$$

The integration constant is therefore in the following form:

$$RCI_o/I_1 \qquad (4)$$

The integration constant for each integrator can thus be varied in direct proportion to $I_o$, or in inverse proportion to $I_1$. By connecting the circuitry which sets up either $I_o$ or $I_1$ in a control circuit such as the phase lock loop of FIG. 2, the integration constants of the individual integrators can be adjusted in common to achieve the desired filter response.

Figure 4:
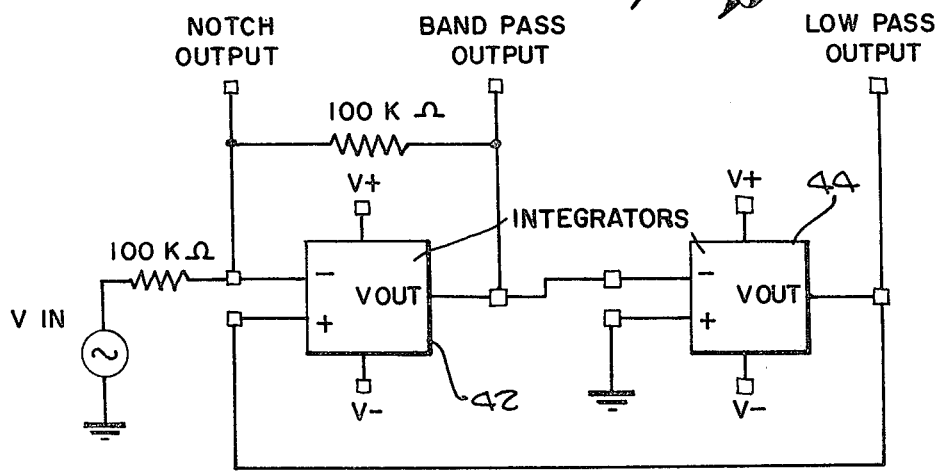
FIG. 4 is a block diagram illustrating the application of the invention in a notch filter.

Another application of the invention is illustrated in FIG. 4. This is a notch filter circuit, which includes integrators 42 and 44 as described above. The input and output terminals of the integrators are shown, other circuit details being omitted for simplicity. In a circuit of this type, with R=100K, C=80pF, and $I_o$=100 micro amp, $I_1$ was varied from 1.0 micro amp to 250 micro amp. The notch frequency was found to vary from 200 hz to 50 khz with less than 2% tracking error.

While particular embodiments of the invention have been described above, numerous variations and modifications are possible. Applications for the invention include filters, oscillators, and voltage or current to frequency converters. Accordingly, it is intended that the invention be limited only in terms of the appended claims.

We claim:

1. An adjustable integrated circuit integrator circuit, comprising:
    an input stage means characterized by a predetermined transconductance, and including means to receive an input voltage signal, and means to establish an output current signal which is related to the input voltage signal by said predetermined transconductance,
    a conditioning stage means comprising a Gilbert multiplier circuit which is connected to receive said output signal from said input stage means, and in response thereto to establish a conditioned output signal, said Gilbert multiplier circuit having an adjustable current source means comprising $I_0$ and $I_1$ current sources and being adapted to receive an adjustment signal and, in response thereto, to adjust the conditioned output signal, the current output of said stage comprising the current output from the input stage multiplied by $I_1/I_0$, and
    an integrating stage means connected to receive the conditioned output signal from the conditioning stage means and in response thereto to provide an integrated output signal,
    said integrating stage means together with said conditioning and input stage means establishing an integration time constant for the integrator circuit, said conditioning stage means including means for controllably adjusting its conditioned output signal, and thereby adjusting the integration time constant of the circuit.

2. The circuit of claim 1, wherein the output from the integrating stage means is responsive substantially only to the conditioned output signal from the conditioning stage means.

3. A controllable intergrated circuit comprising:
    a Gilbert multiplier stage including a pair of $I_o$ current sources and an $I_1$ current source,
    an integrating output stage connected to receive the output of the Gilbert multiplier stage and in response thereto to provide an integrated output signal,
    an input stage having a predetermined transconductance and adapted to receive an input voltage, said input stage being connected in circuit with said $I_o$ current sources to add to one of said $I_o$ current sources and to subtract from the other of said $I_o$ current sources a differential current determined by the magnitude of the input voltage, and
    circuit means for controlling the magnitude of at least one of said $I_o$ and $I_1$ values, and thereby controlling the integration time constant of the integrator circuit.

4. The circuit of claim 3, the input stage for said integrator circuit comprising a transconductance amplifier means adapted to generate said differential current flow through a resistor, said resistor being connected to direct said differential current from one to the other of said $I_o$ current sources.

5. The circuit of claim 4, said transconductance amplifier means including a pair of transistors having their bases connected in circuit with respective ends of said resistor, each of said transistors having one of their collector-emitter terminals connected to receive an input voltage, and current source means connected to the other collector-emitter terminal of said transistors to establish substantially constant transistor base voltages relative to the input voltage.

* * * * *